United States Patent
Kato

(12) United States Patent (10) Patent No.: US 6,943,411 B2
Kato (45) Date of Patent: Sep. 13, 2005

(54) SEMICONDUCTOR DEVICE INCLUDING A LOW RESISTANCE WIRING LAYER

(75) Inventor: Toshikazu Kato, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/658,720

(22) Filed: Sep. 9, 2003

(65) Prior Publication Data

US 2004/0051120 A1 Mar. 18, 2004

(30) Foreign Application Priority Data

Sep. 18, 2002 (JP) ........................................ 2002-271807

(51) Int. Cl.[7] .............................................. H01L 27/01
(52) U.S. Cl. ...................... 257/347; 257/349; 257/350; 257/351; 257/368; 257/369; 257/375
(58) Field of Search ................................. 257/347–354, 257/507, 545, 69, 195, 204, 206, 338, 357–359, 365–377

(56) References Cited

U.S. PATENT DOCUMENTS 5,587,339 A * 12/1996 Wyborn et al. ............. 438/641
5,889,306 A * 3/1999 Christensen et al. ........ 257/350

FOREIGN PATENT DOCUMENTS

JP 10-209468 8/1998

* cited by examiner

*Primary Examiner*—Andy Huynh
(74) *Attorney, Agent, or Firm*—Darryl G. Walker; Bradley T. Sako

(57) ABSTRACT

A semiconductor device can include a low resistance wiring layer (13) formed in, and extending along a base material. A number of element regions (14) are formed separate from one another, each in contact with wiring layer (13). A circuit element can be formed in each element region (14). A metal is preferably used for wiring layer (13). In the above arrangement, metal-oxide-semiconductor (MOS) type transistors can be provided in a silicon-on-insulator (SOI) substrate that can have different potentials applied to a source/drain region with respect to a channel region.

14 Claims, 8 Drawing Sheets

(a)

(b)

US 6,943,411 B2

SEMICONDUCTOR DEVICE INCLUDING A LOW RESISTANCE WIRING LAYER

TECHNICAL FIELD

The present invention relates to generally to a semiconductor device and method of manufacturing the same, and more particularly to silicon-on-insulator (SOI) type device in which circuit elements are formed on an insulating layer and a method of manufacturing the same.

BACKGROUND OF THE INVENTION

Conventionally, a silicon-on-insulator (SOI) device has a basic structure with a semiconductor region, in which circuit elements such as transistors are formed, that is surrounded by an insulating layer, including on a bottom surface. In such an arrangement, junction capacitance, and the like, is reduced, thereby enabling high speed operation.

In the formation of semiconductor devices, in order to realize a desired circuit operation, such as a logic function, it is necessary to connect various circuit elements with wiring layers. In addition, it is necessary to form power source wirings to provide an operation voltage. Such an operating voltage can generally include a power source potential (typically a positive or negative potential) along with a ground potential.

Typically, a large amount of current flows through power source wirings. In addition, it is necessary to provide such wirings to a large number of circuit elements throughout a semiconductor device. As a result, the area occupied by conventional power source wirings can be of considerable size. This can limit the way in which other wirings, such as signal wirings, can be laid out in the semiconductor device.

A conventional technique for simplifying a power source wiring utilizing a conductive stud is disclosed in, by example, Japanese Patent Publication 10-209468 and set forth in FIG. 10.

In FIG. 10, a semiconductor layer 3 is surrounded by an insulating layer 2 formed on a semiconductor substrate 1. A source region 4 and drain region 5 of a metal-oxide-semiconductor (MOS) transistor are formed, with semiconductor layer 3 providing a transistor channel region. In addition, a gate electrode 7 is formed on the channel region over a gate insulating film 6. A drain region 5 is connected with a wiring 10 by way of a conductor 8 within a contact hole formed in an interlayer insulating film 9. Further, a conductive stud 11 is provided that penetrates interlayer insulating film 9, source region 4, semiconductor layer 3, and insulating layer 2, to reach semiconductor substrate 1. The source region 4, semiconductor layer 3 and substrate 1 are electrically connected to one another by way of conductive stud 11. Thus, a semiconductor substrate 1 can be used as a source for supplying a power source potential or a ground potential.

The above conventional approach can have limitations, however. According to such a conventional technique, the only types of transistors that can be employed are those in which a source region 4 and semiconductor layer 3 are maintained at the same potential. Such an arrangement cannot realize circuits like those utilized in a transfer gate, for example, in which source/drain regions have varying potentials with respect to a corresponding substrate (e.g., or body or channel). Thus, such a need cannot be addressed with the conventional conductive stud structure shown in FIG. 10.

In addition, complementary MOS (CMOS) is currently the mainstream technology. In CMOS circuits, two types of power source wirings are typically necessary: a first power source wiring for providing a positive (or negative) potential and a second power source wiring for providing a ground potential. The structure shown in FIG. 10 addresses the supply of only one power source wiring by way of a conductive stud, and not two, as is needed in CMOS technology.

In light of the above, it would be desirable to arrive at some way of providing a power supply wiring for a semiconductor device, such as an SOI device, that does not suffer from the conventional limitations noted above.

SUMMARY OF THE INVENTION

The present invention may include a semiconductor device having a low resistance embedded wiring layer formed on and extending over a semiconductor substrate, and a plurality of element regions formed over the embedded wiring layer. The element regions can be separated from one another and have at least one circuit element formed therein. Each element region can be in contact with the embedded wiring layer. Preferably, an embedded wiring layer can be formed from a metal.

According to such a structure, an embedded wiring layer can be used as a power source wiring for providing a substrate potential. This can allow power source wirings over a top surface of the semiconductor device to be simplified.

Further, in the event element regions include a transistor as the circuit element formed therein, such a transistor can have source and substrate regions provided with different potentials. This can allow the formation of transfer gate, and other type circuits, that might not otherwise be possible with conventional approaches.

At the same time, if a circuit structure is desired in which a source (or drain) and substrate receive the same potential, a deep source (or drain) region can be formed that is deep enough to contact the embedded wiring layer. Such a deep source (or drain) region can be formed utilizing an embedded diffusion region, or an ion implantation technique, as but two examples.

According to one aspect of the embodiments, a plurality of element regions can include at least one supply element region in contact with the embedded wiring layer. Such a supply element region can receive a predetermined power source potential.

According to another aspect of the embodiments, a semiconductor device may further include an insulating layer formed between an embedded wiring layer and a semiconductor substrate. The embedded wiring layer can be electrically connected to the semiconductor substrate through at least one opening in the insulating layer. The semiconductor substrate can receive a predetermined power source potential.

According to another aspect of the embodiments, at least one circuit element can include a transistor having a source region, drain region and channel region formed in an element region. A channel region can be situated between each of the source and drain regions and an embedded wiring layer.

According to another aspect of the embodiments, at least one circuit element can include a transistor having a source region, drain region and channel region formed in an element region. A channel region can be situated between one of the source and drain regions. The other of the source and drain regions can be electrically connected to an embedded wiring layer.

According to another aspect of the embodiments, at least one circuit element can include a transistor having a source region, drain region and channel region formed in the element region. The element region can be surrounded by one or more insulating layers, except for a bottom portion thereof. The source and drain regions can be in contact with at least one insulating layer and not in contact with an embedded wiring layer.

The present invention may also include semiconductor device with a low resistance first embedded wiring layer and a low resistance second embedded wiring layer. Both such wiring layers can be formed on, and extend over a semiconductor substrate. The first embedded wiring layer can be supplied with a first potential and the second embedded wiring layer can be supplied with a second potential different than the first potential. The semiconductor device can also include a plurality of first element regions in contact with the first embedded wiring layer, each having at least one circuit element formed therein. Further, a plurality of second element regions can be in contact with the second embedded wiring layer, and each can include at least one circuit element formed therein.

According to such a structure, transistors having channel conductivity types that are different from one another can be formed. Such an arrangement can enable the formation of a CMOS type device.

According to one aspect of the embodiments, a plurality of first element regions can include at least one first supply element region in contact with the first embedded wiring layer and receiving the first potential. A plurality of second element regions can include at least one second supply element region in contact with the second embedded wiring layer and receiving the second potential.

According to another aspect of the embodiments, an insulating layer can be formed between the first and second embedded wiring layers and the semiconductor substrate. A first potential can be supplied to least one first supply element region in contact with the first embedded wiring. A second embedded wiring layer can be electrically connected to the semiconductor substrate through at least one opening in the insulating layer, and the semiconductor substrate receives the second potential.

According to another aspect of the embodiments, at least one circuit element formed in the plurality of first element regions can include a first conductivity type transistor. At least one circuit element formed in the plurality of second element regions can include a second conductivity type transistor.

According to another aspect of the embodiments, a first embedded wiring layer can be connected to a bottom surface of at least one first element region through bottom contact holes formed through a bottom insulating layer. A top wiring can be connected to a top surface of the at least one first element region through top contact holes aligned over the bottom contact holes.

According to another aspect of the embodiments, at least one circuit element formed in the plurality of first element regions can include a field effect transistor having a first source/drain region, a second source/drain region and a channel region. A first embedded wiring layer can contact the first source/drain region and the channel region, and not contact the second source/drain region.

According to another aspect of the embodiments, at least one circuit element formed in the plurality of first element regions can include a field effect transistor having a first source/drain region, a second source/drain region and a channel region. The first and second source/drain regions can extend from a top surface of the first element region to a bottom surface of the first element region. A first embedded wiring layer can contact the channel region, and not contact the first or second source/drain regions.

According to another aspect of the embodiments, a low resistance first embedded wiring layer and a low resistance second embedded wiring layer can comprise a metal.

The present invention may also include a method of manufacturing a semiconductor device. The method can include the steps of: forming a silicon-on-insulator (SOI) type substrate that includes a first semiconductor substrate, a first insulating film, and a semiconductor layer; forming an insulated gate field effect transistor (IGFET) in a portion of the semiconductor layer separated from other portions of the semiconductor layer by isolation regions of the SOI type substrate; planarizing the first semiconductor substrate to expose the first insulating film; removing at least a portion of the first insulating layer to expose the semiconductor layer; forming a first conductive layer in contact with the first insulating film and the semiconductor layer; forming a second conductive layer on a second semiconductor substrate; bonding the SOI type substrate to the second semiconductor substrate with the first conductive layer in contact with the second conductive layer; and heat treating the SOI type substrate and the second semiconductor substrate to fuse the first conductive layer with the second conductive layer.

According to such a manufacturing method, it is preferable that forming an SOI substrate includes oxidizing a surface of the first semiconductor substrate, oxidizing a surface of a third semiconductor substrate, bonding the oxidized surface of the first semiconductor substrate to the oxidized surface of the third semiconductor substrate, and planarizing the third semiconductor to form the semiconductor layer. In such a way, an SOI substrate for the present invention can be prepared.

Alternatively, forming an SOI type substrate can include implanting oxygen into a semiconductor substrate to form the first insulating film of silicon oxide. The portion of the semiconductor substrate below the first insulating film can be the first semiconductor substrate, and the portion of the semiconductor substrate above the first insulating film can be the semiconductor layer.

According to one aspect of the embodiments, the method may further include patterning the first conductive layer to form a first wiring, forming a second insulating film that covers the first insulating layer and the first wiring, and planarizing the resulting surface to expose the first wiring. In addition, the method can also include patterning the second conductive layer to form a second wiring, forming a fourth insulating film that covers the second insulating layer and second wiring, planarizing a resulting surface until the second wiring is exposed. Bonding the SOI type substrate to the second semiconductor substrate can include bonding the first wiring in contact with the second wiring. Heat treating the SOI type substrate and the second semiconductor substrate can fuse the first wiring with the second wiring.

According to another aspect of the embodiments, forming an IGFET can include etching holes through a top insulating film with a source/drain contact hole mask. Further, removing at least a portion of the first insulating layer to expose the semiconductor layer can include etching through the first insulating layer with a mask developed from the source/drain contact hole mask.

According to another aspect of the embodiments, the other portions of the semiconductor layer include at least one supply portion coupled to a power source potential.

DETAILED DESCRIPTION OF THE EMBODIMENTS

Various embodiments of the present invention will now be described in detail with reference to accompanying drawings.

A first embodiment will now be described.

Figure 1:
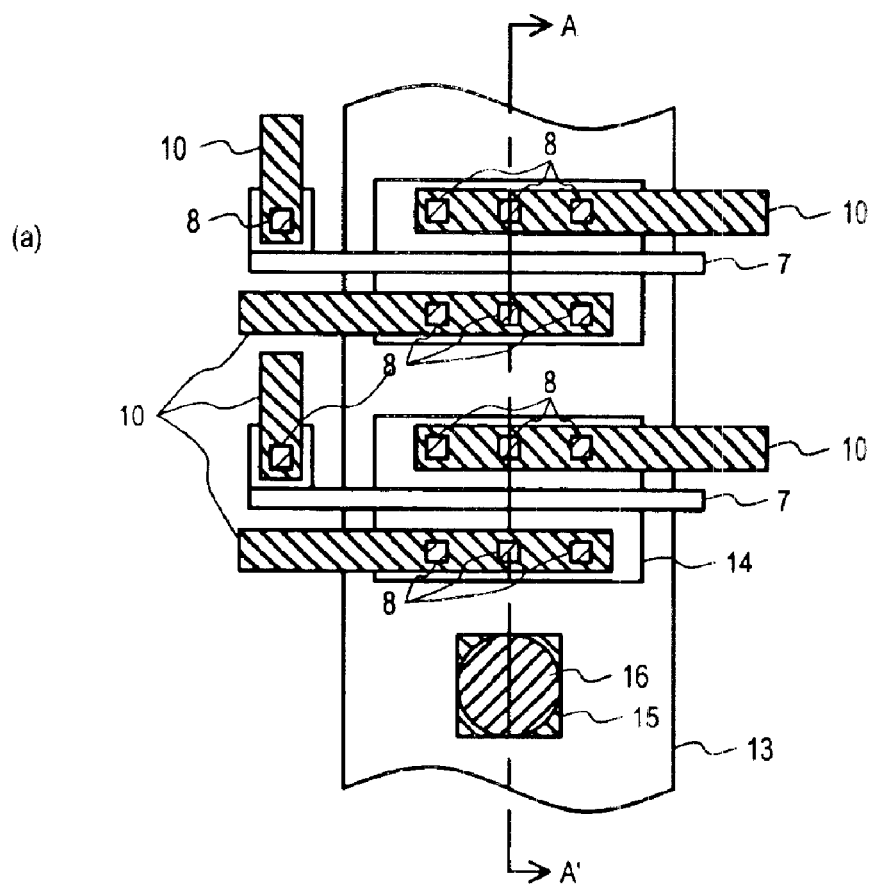
FIG. 1(a) is a top plan view of a first embodiment of the present invention.
FIG. 1(b) is a side cross sectional view taken along line A–A' of FIG. 1(a).
Figure 1:
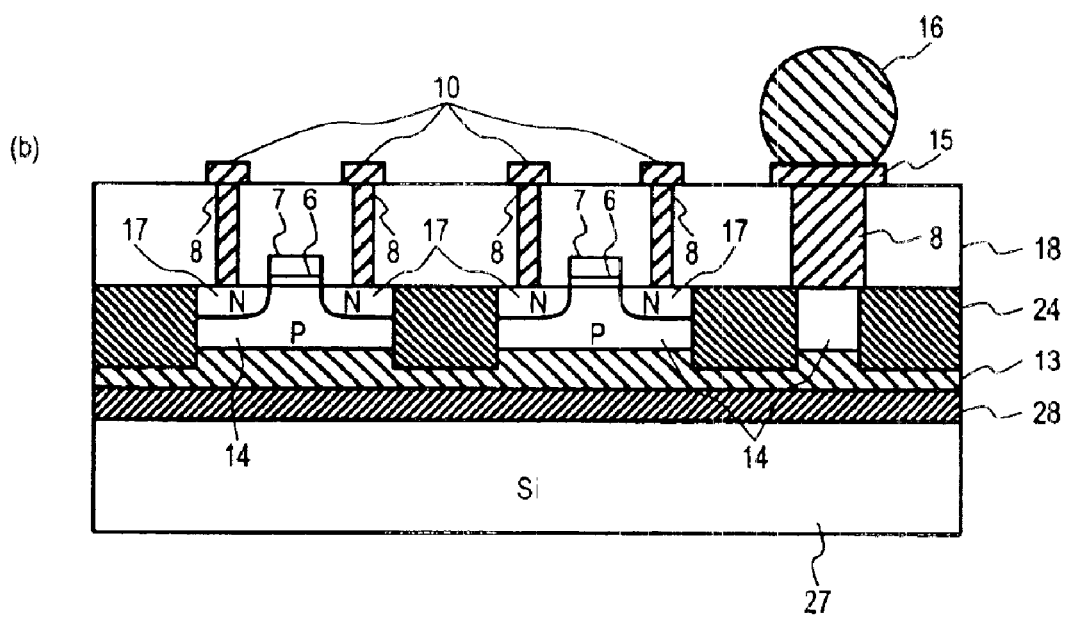
Figure 2:
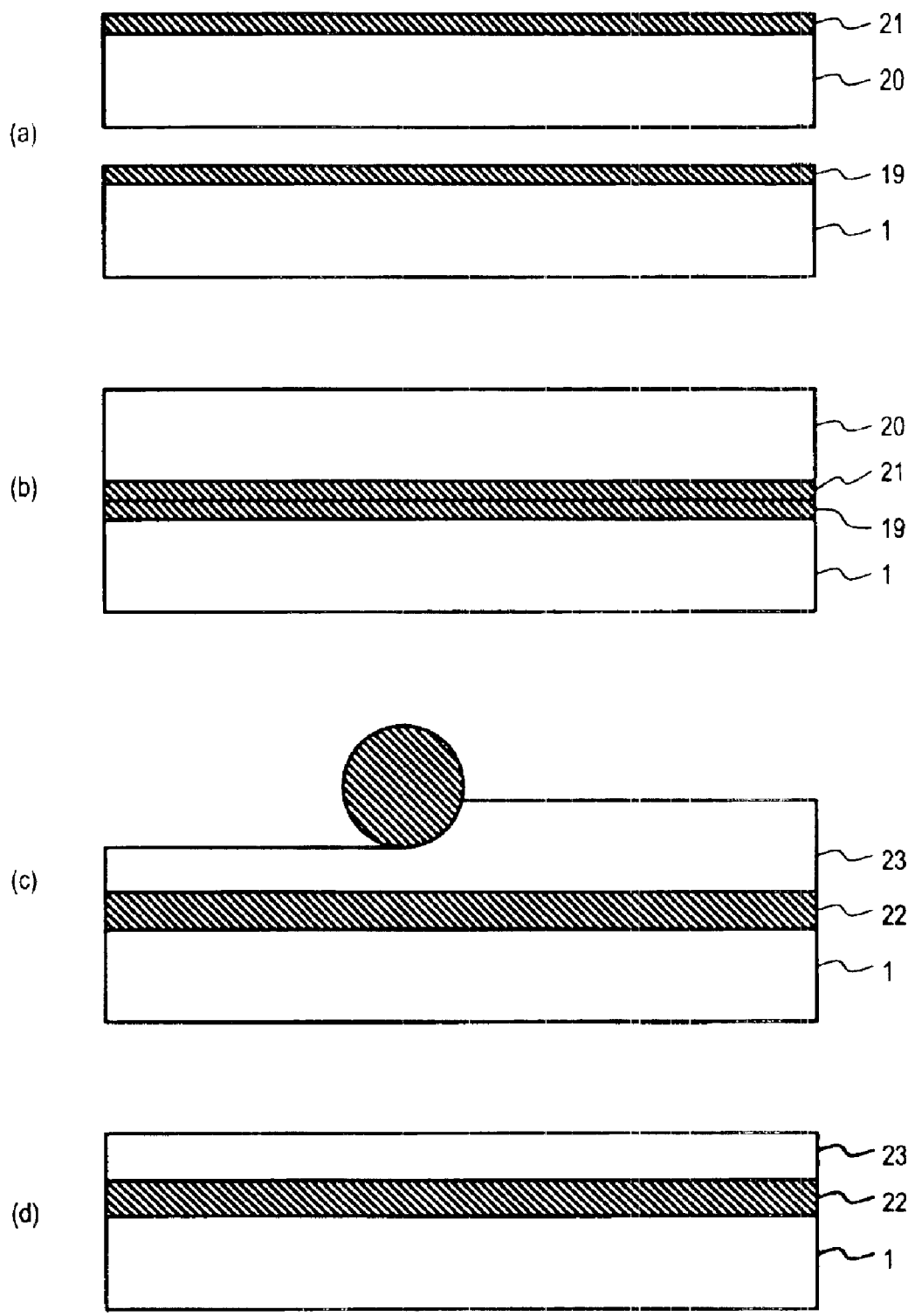
FIGS. 2(a) to 2(d) are side cross sectional views showing a method of manufacturing a semiconductor device like that of FIGS. 1(a) and 1(b).
Figure 3:
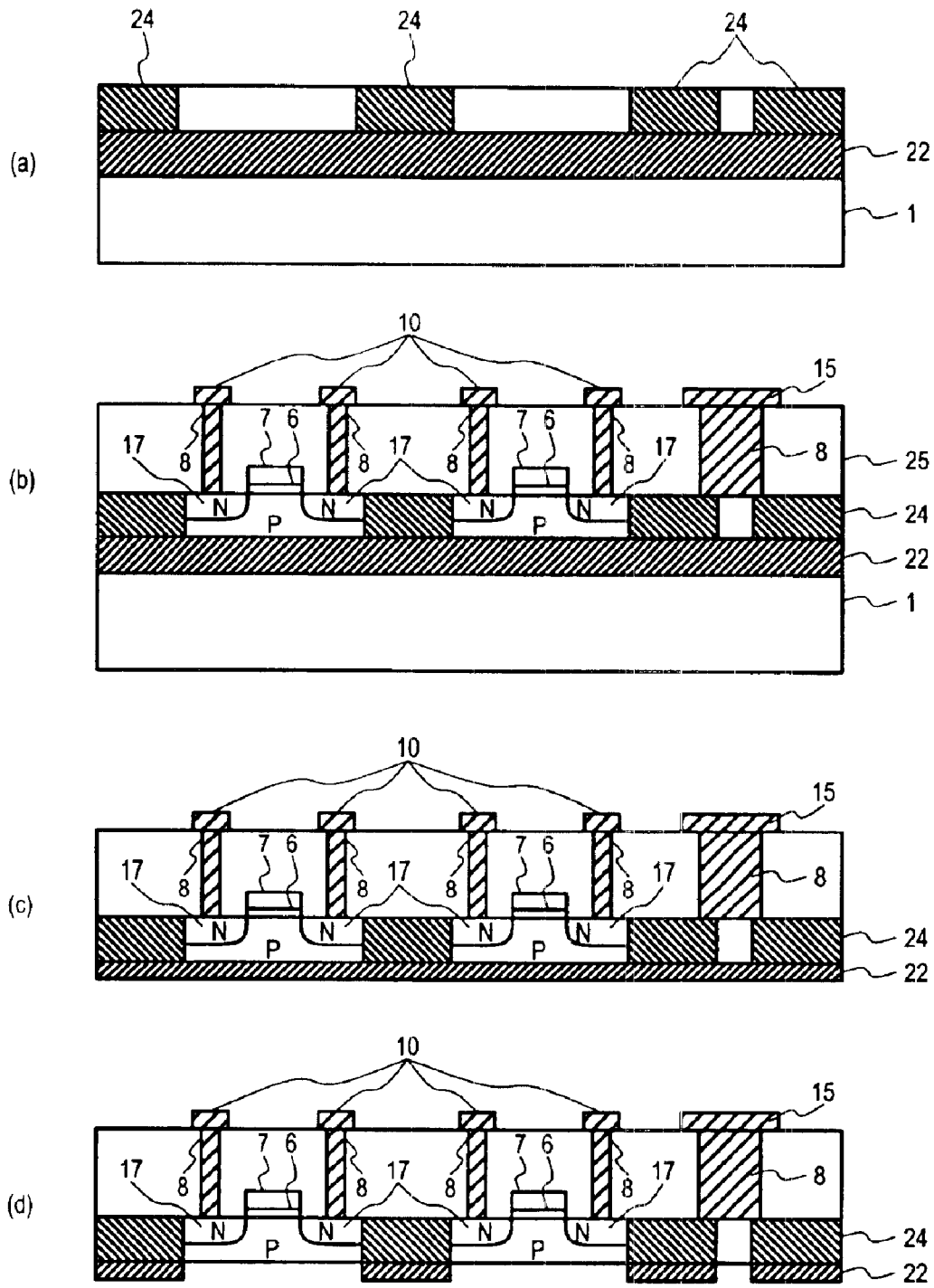
FIGS. 3(a) to 3(d) are side cross sectional views further showing a method of manufacturing a semiconductor device like that of FIGS. 1(a) and 1(b).
Figure 4:
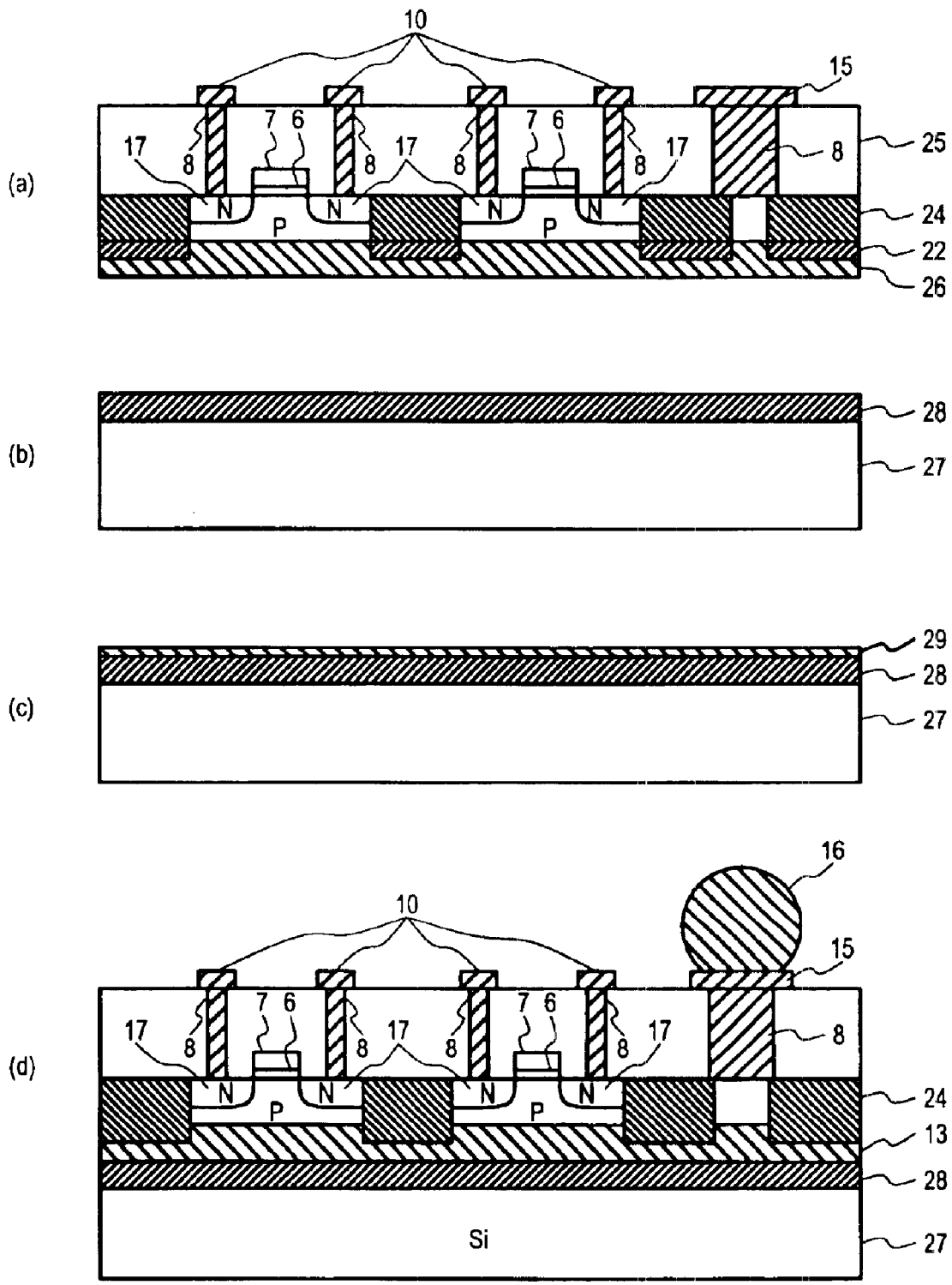
FIGS. 4(a) to 4(d) are side cross sectional views further showing a method of manufacturing a semiconductor device like that of FIGS. 1(a) and 1(b).

FIGS. 1(a) and 1(b) show a first embodiment of the present invention. FIG. 1(a) is a top plan view. FIG. 1(b) is a cross sectional view taken along line A–A' of FIG. 1(a).

A semiconductor device according to a first embodiment can include a silicon substrate 27 as a semiconductor substrate. An insulating layer 28 can be formed over silicon substrate 27. A metallic layer 13 can be formed over insulating layer 28, and may be a low resistance wiring. A number of island-like semiconductor element regions 14 can be formed on the metallic layer 13, and separated from one another by an insulating layer 24.

More particularly, in a first embodiment, a semiconductor device may include a metallic layer 13 embedded in and extending over a silicon substrate 27 with a number of element regions 14 formed thereon (only three of which are shown in FIGS. 1(a) and 1(b)). Each of the element regions 14 can be in contact with the metallic layer 13, while being separately insulated from one another in a lateral direction by insulating layer 24.

A circuit element can be formed in one or more of element regions 14. In the particular embodiment of FIGS. 1(a) and 1(b), an n-channel MOS type transistor is formed as circuit element. That is, n-type source and drain regions 17 can be formed with a p-type channel region therebetween. A gate insulating film 6 and gate electrode 7 can be formed over a channel region. In addition, an element region 14 (e.g., the bottom most element region in FIG. 1(a) and the right most element region in FIG. 1(b)) can be provided as an electrode lead region for a metallic layer 13.

A surface of a semiconductor base material can be covered with an insulating layer 18. Contact holes 8 can be formed in insulating layer 18 to enable electrodes to be formed to element regions 14. A wiring layer 10 can be formed in contact with element regions 14 through contact holes 8. In addition, a contact hole 8 provided to electrode lead region for metallic layer 13 can be filled with a conductor, such as a metal. A pad electrode 15 can be formed thereon. Further, a bump electrode 16 can be formed on the pad electrode 15.

When a semiconductor device according to a first embodiment is incorporated in a package, or the like, and provided with power, a ground potential can be supplied as a power source potential to embedded metallic wiring 13 by way of bump electrode 16. As a result, a ground potential can be supplied to element regions 14 in contact with metallic wiring 13. This can provide a ground potential as a channel potential to MOS transistors within element regions 14. At the same time, source and/or drain regions of the MOS transistors can be connected with one another according to a desired circuit configuration. In addition, connections can include a power source potential wiring (not shown) that can be formed on the surface of insulating layer 18.

Thus, for a device according to a first embodiment, it can be unnecessary to form a wiring layer for supplying a substrate potential to MOS transistors on a surface of the device. In this way, a degree of freedom for other wirings can be increased. In addition, a substrate potential and source/drain potential can be different, thus the device can be adaptable to more circuit structures than conventional approaches (e.g., adaptable for transfer gates, as but one example).

FIGS. 2(a) to 4(d) are side cross sectional views showing a method of manufacturing a semiconductor device like that shown in FIGS. 1(a) and 1(b).

Referring to FIG. 2(a), an upper surface of two semiconductor substrates 1 and 20 can each be oxidized to form oxide film layers 19 and 21.

Referring to FIG. 2(b), oxide film layers 19 and 21 can be bonded to one another.

Referring to FIG. 2(c), a bonding operation can result in semiconductor substrate 20 separated from semiconductor substrate 1 by oxide film layer 22, formed by bonding oxide film layers 19 and 21. As shown in FIG. 2(c), semiconductor substrate 20 can be polished to a desired thickness, which does not reach oxide film layer 22, to form an SOI substrate 23.

FIG. 2(d) shows a device following a polishing step that forms SOI substrate 23.

It is noted that an SOI substrate 23 may be formed by other methods, such as the ion implantation of oxygen, instead of the bonding of two semiconductor substrates to each other.

Referring to FIG. 3(a), an etching can be undertaken that removes SOI substrate 23 except in those regions where element regions are to be formed. An oxide film can be then be formed, by chemical vapor deposition (CVD), for example. The oxide film can then be planarized to form insulating layers 24.

Referring to FIG. 3(b), gate insulating film 6 and gate electrodes 7 can be formed on element regions. Then, source and drain regions 17 can be formed, by ion implantation for example, and an interlayer insulating film 25 can be deposited. Contact holes 8 can be formed in interlayer insulating film 25, and upper layer wirings 10 and pad 15 can be formed in contact holes 8.

Referring to FIG. 3(c), a substrate 1 and part of an oxide film 22 can be removed by polishing.

Referring to FIG. 3(d), those portions of oxide film layer 22 below element regions 14 can be removed, by etching, for example.

Referring to FIG. 4(a), a first conductive film 26, which is aluminum in the example shown, can be deposited on element regions 14 and remaining oxide layer 22 to form a pattern. Further, an oxide film (not shown) can be deposited and planarized.

Referring to FIG. 4(b), on another semiconductor substrate 27, an isolation oxide film 28 can be deposited, or otherwise formed.

Referring to FIG. 4(c), a second conductive film 29, which is aluminum in the example shown, can be deposited thereon to form a pattern. An oxide film (not shown) can be deposited and planarized.

Referring to FIG. 4(d), a first conductive film 26 formed as shown in FIG. 4(a), and a second conductive film 29 formed as shown in FIG. 4(c), can be bonded to each other. Annealing can be carried out at about 660° C., which is a melting point for aluminum. A bump 16 may then be formed on pad 15. In this way, as shown in FIG. 4(d), a semiconductor device can be formed that includes a lower layer metallic wiring 13, made of aluminum, for example.

It is noted that the embodiments described above with reference to FIGS. 1(a) to 4(d) have illustrated a case in which a power source potential (e.g., ground) can be supplied to channel region of n-type MOS transistors. However, the present invention can be similarly applied to a case where a power source potential (e.g., a high power supply voltage) is supplied to channel region of p-channel transistors formed in n-type element regions.

Figure 5:
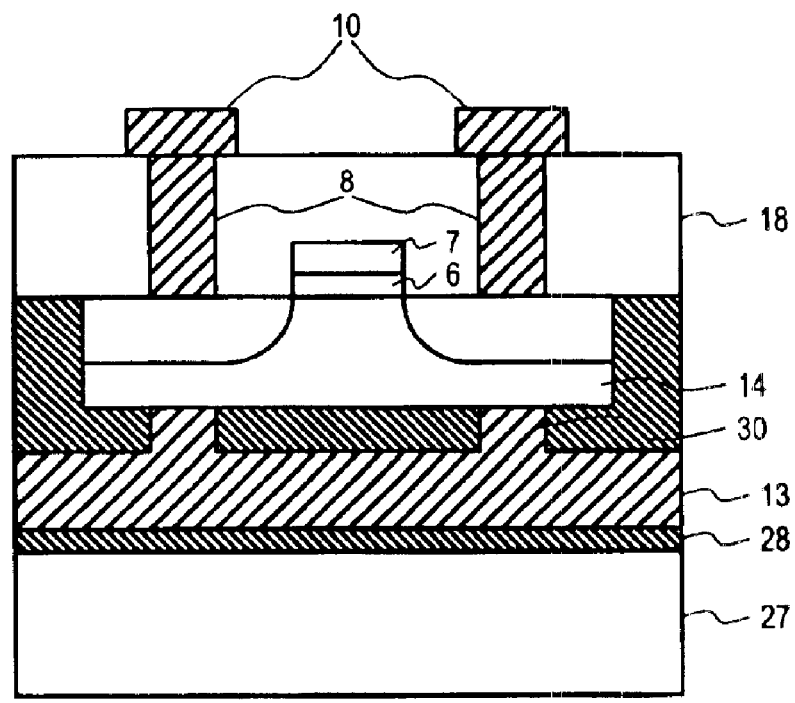
FIG. 5 is a side cross sectional view of a second embodiment of the present invention.

A second embodiment will now be described with reference to FIG. 5. A second embodiment can include some of the same general constituents as set forth in FIG. 1, thus like members will be referred to by the same reference character, and descriptions of such members will be omitted. Further, it is noted that FIG. 5 shows only one MOS transistor, but such a structure may be repeated numerous times in a semiconductor device.

In the embodiment of FIGS. 1(a) and 1(b), an entire bottom surface of element regions 14 can be connected to metallic layer 13. In contrast, in the embodiment of FIG. 5, first lower layer wiring contacts 30 can be provided in positions corresponding to contact holes 8 to source and drain regions. With such a structure, a mask used for forming contact holes 8 for source and drain regions can be used to form first lower layer wiring contacts 30. Therefore, a new mask for first lower layer wiring contacts 30 may not be necessary, and mask production costs can be reduced.

Figure 6:
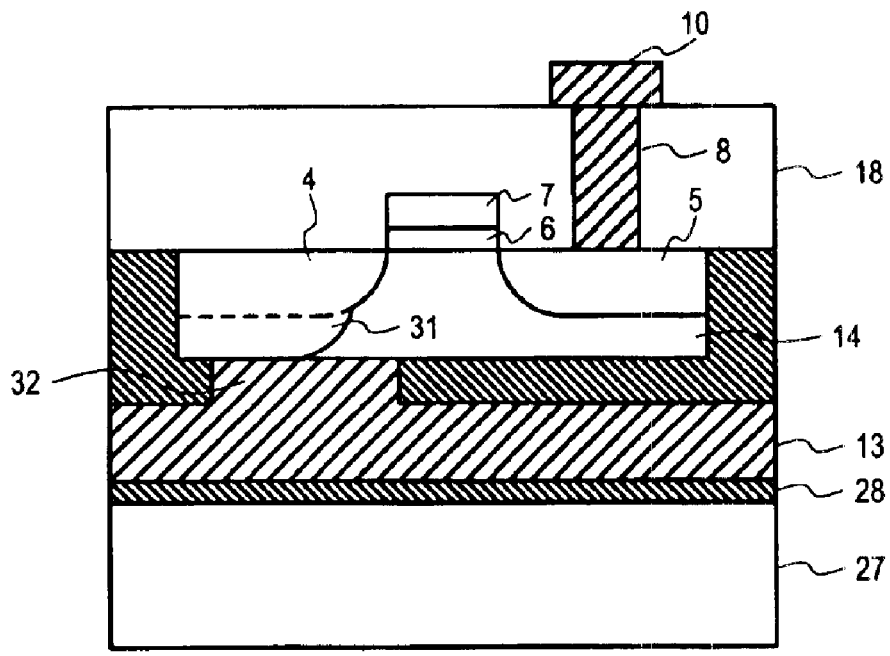
FIG. 6 is a side cross sectional view of a third embodiment of the present invention.

A third embodiment will now be described with reference to FIG. 6. Like FIG. 5, the example of FIG. 6 shows only one MOS transistor, but it is understood that such a structure may be repeated numerous times in a semiconductor device. In addition, the embodiment of FIG. 6 corresponds to a device in which a channel and source are maintained at the same potential. In the embodiment of FIG. 6, a MOS transistor can include a deep impurity region 31, of the same conductivity type as source region 4, formed below the source region 4. Deep impurity region 31 can be formed in contact with metallic layer 13. As a result, a source region 4 can receive a substrate potential (e.g., ground in the case of an n-channel MOS transistor) through metallic layer 13.

In the case of an n-channel MOS transistor, a region 31 can be n-type and form a p-n junction with element region 14, which can include a channel region for the MOS transistor. Metallic layer 13 can be formed to also extend over element region 14 so as to form a short circuit across such a p-n junction.

It is also noted that in the third embodiment of FIG. 6 an insulating layer 24 can extend to a region corresponding to a gate region of a resulting MOS transistor. Such an extending insulating layer can reduce junction capacitance, and the like. However, an insulating layer 24 may also be formed as shown in FIG. 1(b).

Figure 7:
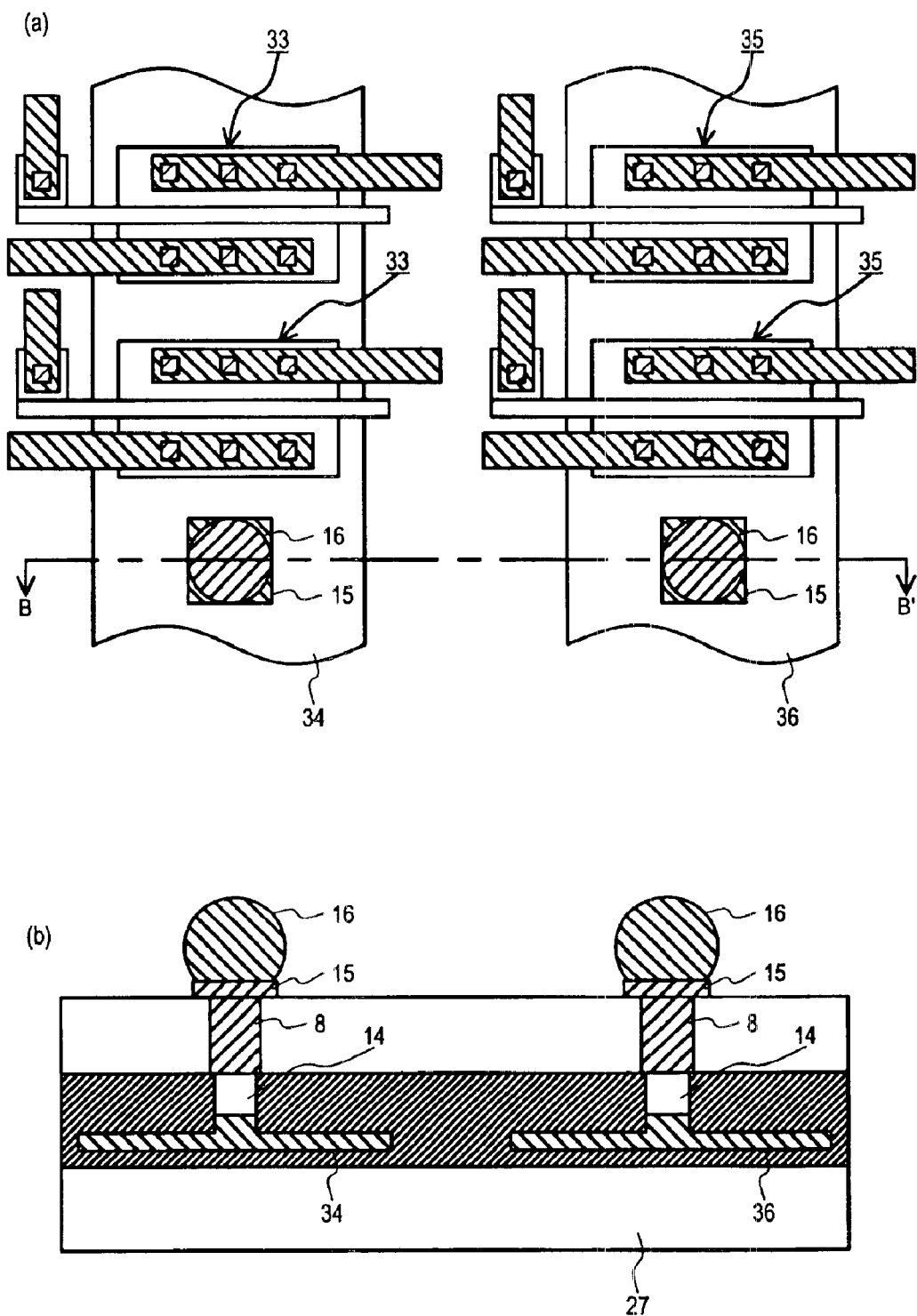
FIG. 7(a) is a top plan view of a fourth embodiment of the present invention.
FIG. 7(b) is a side cross sectional view taken along line B–B' of FIG. 7(a).

A fourth embodiment will now be described with reference to FIGS. 7(a) and 7(b). FIG. 7(a) is a top plan view. FIG. 7(b) is a cross sectional view taken along line B–B' of FIG. 7(a).

The embodiment of FIGS. 7(a) and 7(b) can be used for a CMOS structure. That is, two kinds of embedded low resistance wiring layers can be provided by metallic layers 34 and 36 embedded in a semiconductor base material. A ground potential can be supplied as one power source potential to metallic layer 34. Metallic layer 34 can thus supply a ground potential to element regions containing n-channel MOS transistors 33. A positive potential can be supplied as another power source potential to metallic layer 36. Metallic layer 36 can thus supply a positive potential to element regions containing p-channel MOS transistors 35.

A ground potential metallic layer 34 and positive potential metallic layer 36 can be connected to pads 15 through respective element regions 14 and contact holes 8. Bumps 16 can be formed on respective pads 15.

Thus, two kinds of power source potential wirings for two different channel potentials, required for a CMOS structure, can be provided without being formed on a top surface of the device.

It is noted that each of MOS transistors 33 and 35 shown in FIG. 7(a) can have essentially the same structure as shown in FIG. 1(b). Further, a structure such as that shown in FIG. 5 or FIG. 6 can be adopted in an arrangement like that of the fourth embodiment.

A fifth embodiment will now be described with reference to FIG. 8. In a fifth embodiment, a semiconductor (e.g., silicon) substrate 27 can be actively used as a potential supplying medium. That is, an n-type channel MOS transistor 33 can be connected to a ground potential by way of a wiring 10, a contact hole 8, an element region 14, and ground potential metallic wiring 34. Such a ground potential can be supplied to an upper layer metallic wiring 10. As but one example, a bump electrode structure can be adopted to supply such a potential.

On the other hand, a p-type channel MOS transistor 35 can be connected with a positive power supply potential by way of semiconductor substrate 27 and a substrate contact 37. Such a positive power supply potential can be supplied to semiconductor substrate 27.

Figure 8:
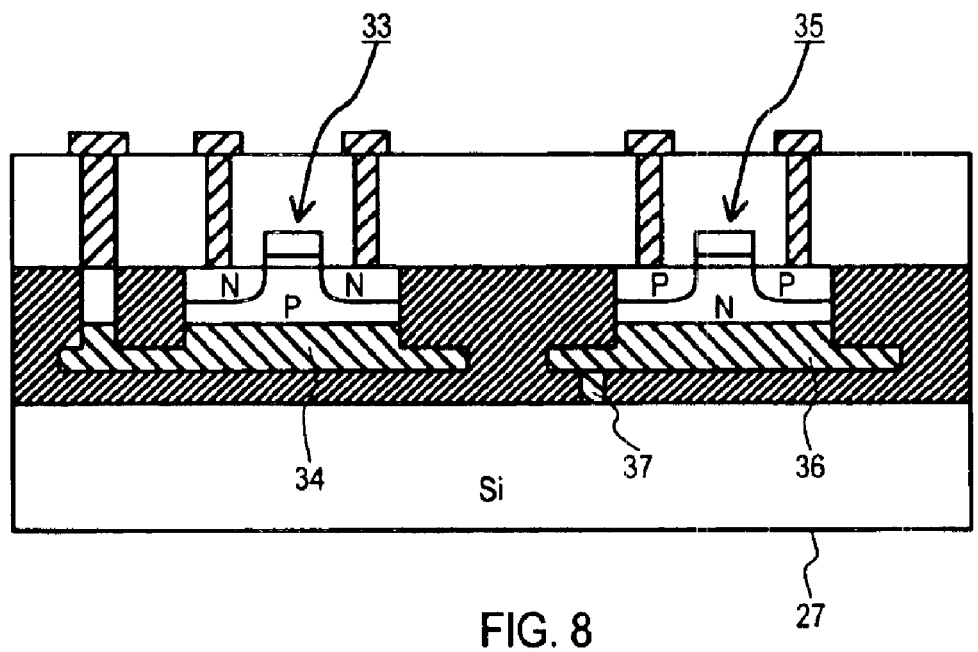
FIG. 8 is a side cross sectional view of a fifth embodiment of the present invention.

FIG. 8 shows an embodiment in which power supply contact wirings can be simplified even further. Of course, the manner of supplying power source potentials could be reversed. That is, a ground potential for n-type MOS transistors could be supplied via a substrate 27, while a positive power supply potential for p-type MOS transistors could be supplied via a wiring 10.

Figure 9:
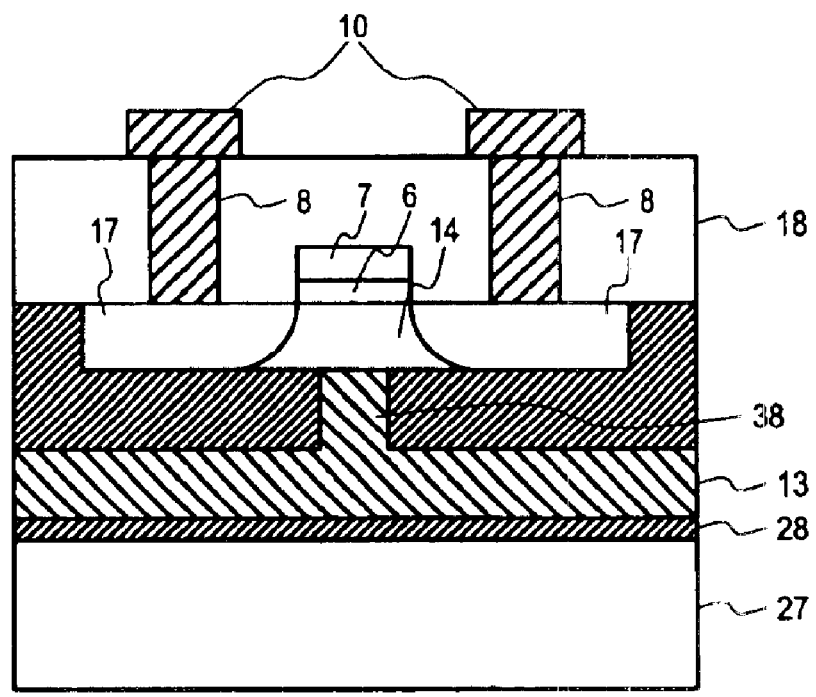
FIG. 9 is a side cross sectional view of a sixth embodiment of the present invention.
Figure 10:
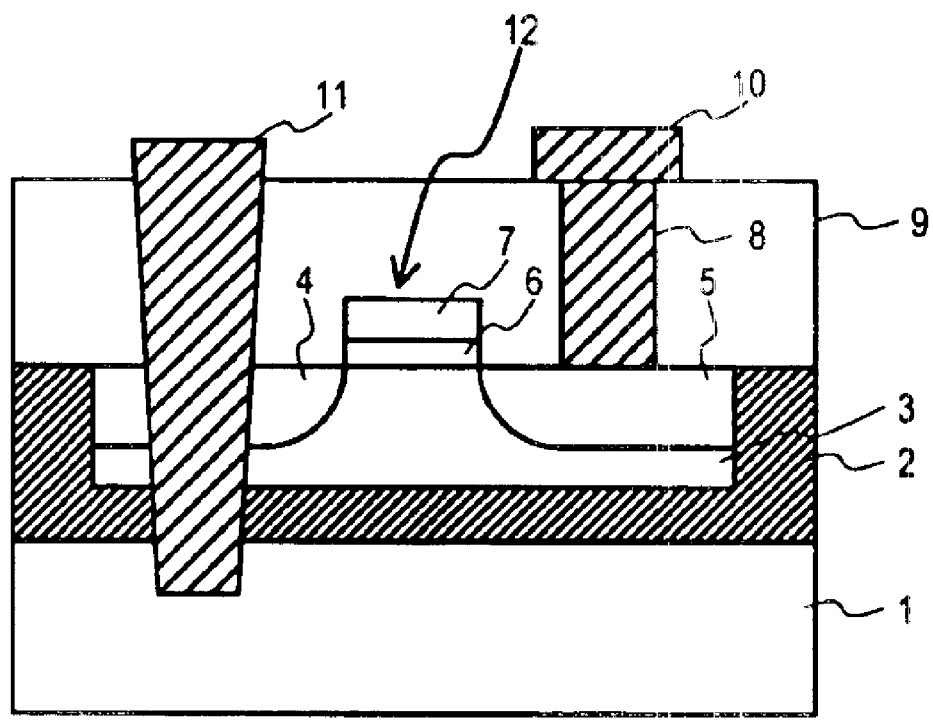
FIG. 10 is a side cross sectional view of a conventional semiconductor device.

A sixth embodiment will now be described with reference to FIG. 9. In a sixth embodiment, source and drain regions 17 can be formed in contact with a lower surface of an element region 14. In addition, a lower layer wiring 13 can be connected to an element region 14 only through a third lower layer contact 38. In the embodiment of FIG. 9, charges stored on element region 14 can be reduced, resulting in lower junction capacitance for source and drain regions 17.

A sixth embodiment can be applied to any of the first through fifth embodiments. It is noted that when it is desired to make a substrate potential and source potential equal to one another, the position of third lower layer contact 38 would be shifted to provide the desired short circuit across the p-n junction between the source region 17 and element region 14.

As has been described, in a semiconductor device according to the present invention, a wiring can be provided in a substrate side near to a MOS transistor. A power source potential can be supplied to the MOS transistor by way of the wiring. As a result, areas occupied by a power source wiring can be reduced, leading to overall reductions in semiconductor device size.

It is noted that while the various embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor device, comprising:
a low resistance embedded wiring layer formed on and extending over a semiconductor substrate; and
a plurality of element regions formed over the embedded wiring layer separated from one another and having at least one circuit element formed therein, each element region being in contact with the embedded wiring layer.

2. The semiconductor device of claim 1, wherein:
the plurality of element regions includes at least one supply element region in contact with the embedded wiring layer and receiving a predetermined power source potential.

3. The semiconductor device of claim 1, further including:
an insulating layer formed between the embedded wiring layer and the semiconductor substrate;
the embedded wiring layer is electrically connected to the semiconductor substrate through at least one opening in the insulating layer; and
the semiconductor substrate receives a predetermined power source potential.

4. The semiconductor device of claim 1, wherein:
the at least one circuit element includes a transistor having a source region, drain region, and channel region formed in the element region, the channel region being situated between each of the source and drain regions and the embedded wiring layer.

5. The semiconductor device of claim 1, wherein:
the at least one circuit element includes a transistor having a source region, drain region, and channel region formed in the element region, the channel region being situated between one of the source and drain regions, and the other of the source and drain regions being electrically connected to the embedded wiring layer.

6. The semiconductor device of claim 1, wherein:
the at least one circuit element includes a transistor having a source region, drain region, and channel region formed in the element region, the element region being surrounded by at least one insulating layer except for a bottom portion thereof, the source and drain regions being in contact with the at least one insulating layer and not in contact with the embedded wiring layer.

7. A semiconductor device, comprising:
a low resistance first embedded wiring layer and a low resistance second embedded wiring layer both formed on and extending over a semiconductor substrate, the first embedded wiring layer supplied with a first potential and the second embedded wiring layer supplied with a second potential different than the first potential;
a plurality of first element regions in contact with the first embedded wiring layer, each having at least one circuit element formed therein; and
a plurality of second element regions in contact with the second embedded wiring layer, each having at least one circuit element formed therein.

8. The semiconductor device of claim 7, wherein:
the plurality of first element regions includes at least one first supply element region in contact with the first embedded wiring layer and receiving the first potential; and
the plurality of second element regions includes at least one second supply element region in contact with the second embedded wiring layer and receiving the second potential.

9. The semiconductor device of claim 7, further including:
an insulating layer formed between the first and second embedded wiring layers and the semiconductor substrate;
the first potential is supplied to at least one first supply element region in contact with the first embedded wiring; and
the second embedded wiring layer is electrically connected to the semiconductor substrate through at least one opening in the insulating layer, and the semiconductor substrate receives the second potential.

10. The semiconductor device of claim 7, wherein:
the at least one circuit element formed in the plurality of first element regions comprises a first conductivity type transistor; and
the at least one circuit element formed in the plurality of second element regions comprises a second conductivity type transistor.

11. The semiconductor device of claim 7, wherein:
the first embedded wiring layer is connected to a bottom surface of at least one first element region through bottom contact holes formed through a bottom insulating layer and a top wiring is connected to a top surface of the at least one first element region through top source/drain contact holes aligned over the bottom contact holes.

12. The semiconductor device of claim 7, wherein:
the at least one circuit element formed in the plurality of first element regions comprises a field effect transistor having a first source/drain region, a second source/drain region, and a channel region; and
the first embedded wiring layer contacts the first source/drain region and the channel region, and does not contact the second source/drain region.

13. The semiconductor device of claim 7, wherein:
at least one circuit element formed in the plurality of first element regions comprises a field effect transistor having a first source/drain region, a second source/drain region, and a channel region, the first and second source/drain regions extending from a top surface of the first element region to a bottom surface of the first element region; and
the first embedded wiring layer contacts the channel region, and does not contact the first or second source/drain regions.

14. The semiconductor device of claim 7, wherein:
the low resistance first embedded wiring layer and the low resistance second embedded wiring layer comprise a metal.

* * * * *